United States Patent [19]

Coverdell et al.

[11] Patent Number: 5,525,405

[45] Date of Patent: Jun. 11, 1996

[54] ADHESIVELESS AROMATIC POLYIMIDE LAMINATE

[75] Inventors: Darrel E. Coverdell, Amanda; Harrison V. Gumm, Chillicothe; Mark E. McAlees, Circleville, all of Ohio

[73] Assignee: E. I. Du Pont de Nemours and Company, Wilmington, Del.

[21] Appl. No.: 355,467

[22] Filed: Dec. 14, 1994

[51] Int. Cl.⁶ .............................. B32B 7/02; B32B 27/00
[52] U.S. Cl. ..................... 428/213; 428/215; 428/216; 428/220; 428/334; 428/473.5
[58] Field of Search .......................... 427/307.1, 308.2, 427/331.1; 428/213, 215, 216, 220, 334, 473.5

[56] References Cited

U.S. PATENT DOCUMENTS

| | | | |
|---|---|---|---|
| 5,178,964 | 1/1993 | Scola et al. | 428/473.5 |
| 5,218,034 | 6/1993 | Milligan et al. | 524/399 |
| 5,227,244 | 7/1993 | Milligan | 428/458 |
| 5,272,194 | 12/1993 | Arduengo et al. | 524/177 |
| 5,358,782 | 10/1994 | Parish | 428/323 |

Primary Examiner—D. S. Nakarani

[57] ABSTRACT

An aromatic polyimide laminate having a thickness of at least 50 microns composed of multiple aromatic polyimide film layers containing from 400 to 10,000 ppm of tin, superimposed on and directly bonded to each other without using an adhesive. The polyimide laminates can be used in various thick film applications such as punched gaskets and washers, speaker coils, shim stock, circuit boards and machined parts.

21 Claims, 1 Drawing Sheet

ADHESIVELESS AROMATIC POLYIMIDE LAMINATE

BACKGROUND OF THE INVENTION

1. Field of the Invention

The present invention relates to an aromatic polyimide laminate and to a process for preparing the same. More particularly, the present invention relates to an aromatic polyimide laminate, having a thickness of 50 microns or more, comprising multiple aromatic polyimide film layers superimposed on and directly bonded to each other without using an adhesive. The polyimide laminates have excellent heat resistance, durability and adhesive bonding properties and can be used in various applications such as punched gaskets and washers, speaker coils, shim stock and circuit boards.

2. Description of the Prior Art

Commercial applications exist which require polyimide laminate structures ranging from 125 microns to 1500 microns or more in thickness. However, current aromatic polyimide films having a thickness of from about 25 microns to 125 microns are conventionally produced by casting a solution of a poly(amic acid) precursor of the polyimide in an organic solvent onto the surface of a support and then solidifying the thin solution layer to provide the polyimide film. This conventional method has disadvantages, since the polyimide polymer has poor solubility in the organic solvent and the resulting solution has high viscosity, thereby making thick film-formation difficult.

Accordingly, using the conventional method, it is difficult to produce a polyimide film having a thickness of, for example, 125 microns or more having satisfactory quality and at high reproducibility.

Furthermore, it is well-known that almost all aromatic polyimide polymers are non-fusible. Therefore, direct bonding of conventional aromatic polyimide films to each other to form thick laminates without using an adhesive or a bonding film, e.g. a fluorine-containing thermoplastic film, is very difficult.

Moreover, even if the aromatic polyimide films can be bonded to each other using an adhesive, the resultant polyimide laminate contains an adhesive layer which usually has a much poorer heat resistance and durability than those of the aromatic polyimide film and, thus, exhibits decreased heat resistance and durability.

U.S. Pat. No. 5,227,244, issued to Milligan on Jul. 13, 1993, discloses a poly(amic acid) film coated with an organic solvent solution of a metal salt and heating the coated film to convert the poly(amic acid) to the polyimide. A laminate of the polyimide film with a copper foil exhibits improved adhesion when bonded together using an acrylic adhesive.

U.S. Pat. No. 5,218,034, issued to Milligan et al on Jun. 8, 1993, discloses adhesively bonded polyimide film copper laminates wherein the polyimide film contains from 0.02 to 1% by weight of tin introduced as a tin (II) or tin (IV) salt.

U.S. Pat. No. 5,272,194, issued to Arduengo et al on Dec. 21, 1993, discloses a polyimide film containing from 0.02 to 1% by weight of metal from an organometallic compound wherein the metal is tin, bismuth or antimony, which has improved adhesion when bonded to a metal foil through a heat-resistant adhesive.

In the aforementioned patents, the metal containing or metal coated polyimide film is directly bonded to a metallic substrate through an adhesive. There is no disclosure of adhesiveless polyimide laminates having thickness of 50 microns or more formed by bonding multiple layers of polyimide films at high temperature and pressure.

Accordingly, there is a need for an aromatic polyimide laminate having a relatively large thickness of 50 microns or more and which does not use an adhesive bonding agent.

SUMMARY OF THE INVENTION

According to the present invention, there is provided an aromatic polyimide laminate, having a thickness of at least 50 microns, comprising multiple aromatic polyimide film layers superimposed on and directly bonded to each other without using an adhesive, wherein each of said aromatic polyimide film layers independently contains from 400 to 10,000 ppm of tin.

In a further embodiment of the present invention, the above mentioned aromatic polyimide laminate can be produced by the process of the present invention, which comprises the steps of:

(a) superimposing multiple layers of aromatic polyimide film comprising the polymerization-imidization product of an aromatic tetracarboxylic dianhydride component and an aromatic diamine component to form a precursor laminate material, wherein each of said aromatic polyimide film layers contains from 400 to 10,000 ppm of tin; and (b) heat-pressing said precursor laminate material at a temperature of from 400° to 455° C. under a pressure of from 24 bar to 690 bar for from 5 minutes to 3 hours, to directly bond said aromatic polyimide film layers to each other without using an adhesive.

DETAILED DESCRIPTION OF THE INVENTION

Figure 1:
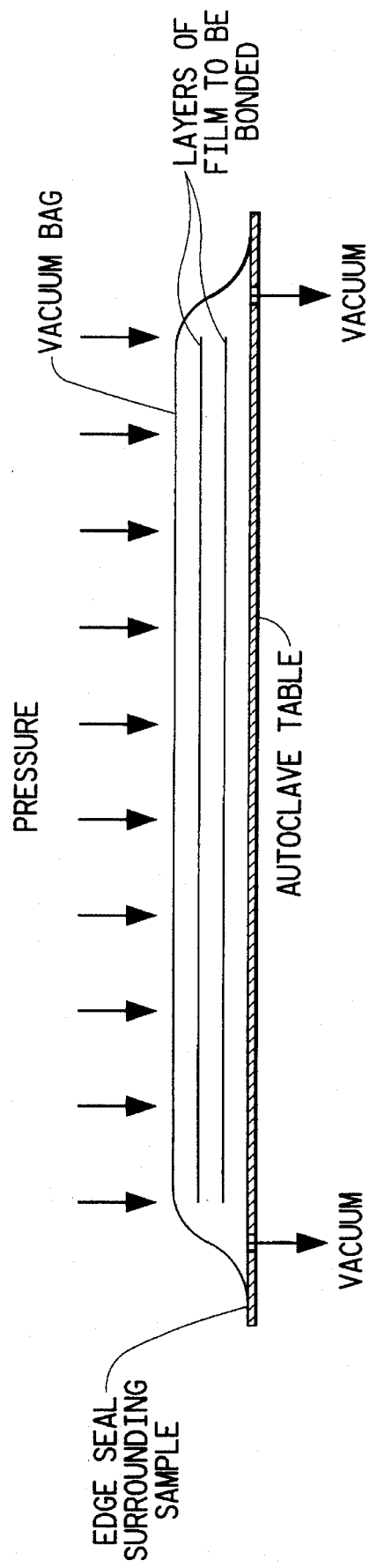
FIG. 1 is a schematic illustration of the autoclave assembly used for laminating layers of polyimide film according to the present invention.

The aromatic polyimide laminate of the present invention has a relatively large thickness of 50 microns or more and comprises multiple layers of an aromatic polyimide film which are directly bonded to each other without using an adhesive.

Since no adhesive is used, the aromatic polyimide laminate can be advantageously produced at a low cost and is free from disadvantages such as unsatisfactory heat resistance, chemical resistance and moisture resistance due to the presence of the adhesive layer. Furthermore, even in spite of the fact that no adhesive is used, the aromatic polyimide film layers can be firmly bonded to each other by means of a heat-pressing procedure.

In the aromatic polyimide laminate of the invention, the multiple polyimide film layers can be the same or they can be different and can have the same or different thicknesses. Preferably, the polyimide film layers consist of the same type of aromatic polyimide and have the same thickness. Alternatively, the polyimide film layers may consist of the same type of aromatic polyimide and may have different thicknesses. Furthermore, the polyimide film layers may consist of different types of aromatic polyimides having the same or different thicknesses.

The polyimide films used in the aromatic polyimide laminate of the invention comprise the polymerization-imidization product of an aromatic tetracarboxylic dianhydride component and an aromatic diamine component and can be prepared generally as disclosed in U.S. Pat. Nos. 3,179,630 and 3,179,634.

The poly(amic acid)s are made by dissolving substantially equimolar amounts of at least one aromatic tetracarboxylic dianhydride and at least one aromatic diamine in an organic polar solvent and agitating the resulting solution under controlled temperature conditions until polymerization of the aromatic dianhydride and the aromatic diamine is completed.

Suitable dianhydrides for use in the polyimide films include: pyromellitic dianhydride; 2,3,6,7-naphthalene tetracarboxylic dianhydride; 3,3',4,4'-biphenyl tetracarboxylic dianhydride; 1,2,5,6-naphthalene tetracarboxylic dianhydride; 2,2',3,3'-biphenyl tetracarboxylic dianhydride; 3,3',4,4'-benzophenone tetracarboxylic dianhydride; 2,2-bis(3,4-dicarboxyphenyl) propane dianhydride; 3,4,9,10-perylene tetracarboxylic dianhydride; 1,1-bis(2,3-dicarboxyphenyl) ethane dianhydride; 1,1-bis(3,4-dicarboxyphenyl) ethane dianhydride; bis(2,3-dicarboxyphenyl) methane dianhydride; bis(3,4-dicarboxyphenyl) methane dianhydride; oxydiphthalic dianhydride; bis(3,4-dicarboxyphenyl) sulfone dianhydride; and the like.

Suitable aromatic diamines for use in the polyimide films include: 4,4'-diaminodiphenyl propane; 4,4'-diamino-diphenyl methane; benzidine; 3,4'-dichlorobenzidine; 4,4'-diaminodiphenyl sulfide; 3,4'-diaminodiphenyl sulfone; 4,4'-diaminodiphenyl sulfone; 4,4'-diaminodiphenyl ether; 3,4'-diaminodiphenyl ether; 1,5-diaminonaphthalene; 4,4'-diaminodiphenyl diethylsilane, 4,4'-diaminodiphenylsilane; 4,4'-diaminodiphenyl ethyl phosphine oxide; 4,4'-diaminodiphenyl N-methyl amine; 4,4'-diaminodiphenyl N-phenylamine; 1,4-diaminobenzene (p-phenylene diamine); 1,3-diaminobenzene; 1,2-diaminobenzene; and the like.

A preferred polyimide film for use in this invention is derived from 4,4'-diaminodiphenyl ether and pyromellitic dianhydride.

Copolyimides derived from any of the above diamines and dianhydrides can also be used. Particularly preferred copolyimides are those derived from 15 to 85 mole % of biphenyltetracarboxylic dianhydride, 15 to 85 mole % of pyromellitic dianhydride; 30 to 100 mole % p-phenylene diamine and 0 to 70 mole % of 4,4'-diaminodiphenyl ether and are described in U.S. Pat. No. 4,778,872. A preferred copolyimide film for use in this invention is derived from 60 mole % pyromellitic dianhydride, 40 mole % 3,3',4,4'-biphenyltetracarboxylic dianhydride, 60 mole % p-phenylene diamine and 40 mole % 4,4'-diaminodiphenyl ether.

The organic solvent must dissolve one or both of the polymerizing reactants and, preferably, should dissolve the poly(amic acid) polymerization product. The solvent must be substantially unreactive with all of the polymerizing reactants and with the poly(amic acid) polymerization product.

Preferred organic solvents include normally liquid N,N-dialkylcarboxylamides, generally. Preferred solvents include the lower molecular weight members of such carboxylamides, particularly N,N-dimethylformamide and N,N-dimethylacetamide. Other solvents which may be used are dimethylsulfoxide, N-methyl-2-pyrrolidone, tetramethyl urea, dimethylsulfone, hexamethylphosphoramide, tetramethylene sulfone, and the like. The solvents can be used alone, in combinations with one another or in combinations with poor solvents such as benzene, benzonitrile, dioxane, etc. The amount of solvent used preferably ranges from 75 to 90 weight % of the poly(amic acid), since this concentration has been found to give optimum molecular weight.

The poly(amic acid) solutions are generally made by dissolving the aromatic diamine in a dry solvent and slowly adding the aromatic dianhydride under conditions of agitation and controlled temperature in an inert atmosphere. The aromatic diamine is conveniently used as a 5 to 15 weight percent solution in the organic solvent and the aromatic diamine and aromatic dianhydride are usually used in about equimolar amounts.

The poly(amic acid) can be cast as either a partially cured "gel film" or a "solvated film". The term "gel film" used herein means a sheet of the poly(amic acid) polymer which is laden with volatiles, primarily organic solvent, to such an extent that the polymeric material is in a gel-swollen, plasticized, rubbery condition. The gel film thickness generally falls in the range of 50 microns to 625 microns. The volatile content is usually in the range of 80 to 90% by weight of the gel film. The gel film is self-supporting and partially and incompletely cured, i.e., is at an intermediate stage of curing from poly(amic acid) to polyimide.

The gel film structure can be prepared by the chemical conversion process described in U.S. Pat. No. 3,410,826 by mixing a chemical converting agent and a catalyst, such as a lower fatty acid anhydride and a tertiary amine, respectively, into the poly(amic acid) solution at a low temperature, followed by casting the poly(amic acid) solution in film form on a casting surface and then mildly heating at, for example, 100° C. to activate the conversion agent and catalyst for transforming the cast film to a poly(amic acid-)polyimide gel film.

The gel film is subsequently dried to remove the water, residual organic solvent, and the remaining conversion chemicals, and the poly(amic acid) is completely converted to polyimide. The drying can be conducted at relatively mild conditions without complete conversion of poly(amic acid) to polyimide at that time, or the drying and conversion can be conducted at the same time using higher temperatures. Because the gel film has so much liquid which must be removed during the drying and converting steps, it must be restrained during drying to avoid undesired shrinkage. In continuous production, the film can be held at the edges, such as in a tenter frame using tenter clips or pins for restraint. A polyimide film which is permitted to shrink excessively during drying and conversion is brittle and lacks the superior performance characteristics expected of polyimide film materials.

Preferably, high temperatures are used for short times to dry the film and convert it to polyimide in the same step. It is preferred to heat the film to a temperature of greater than 350° C., most preferably, greater than 400° C. for 15° to 400 seconds. During this drying and converting process, the film is restrained from undue shrinking and, in fact, can be stretched by as much as 200% of its initial dimension prior to completion of the drying and conversion. Stretching can be in any dimension. In film manufacture, stretching can be in either the longitudinal direction or the transverse direction. If desired, restraint can also be provided to permit some limited degree of shrinkage. Shrinkage of as much as 15% has been found to provide an adequate product.

A "solvated film" of the poly(amic acid) is a film which is all poly(amic acid) or which has only a low polyimide content, for example 0 to 25%, and which is about 50 to 75% by weight polymer and 25 to 50% by weight solvent. Such film is sufficiently strong to be self-supporting.

The solvated poly(amic acid) can be prepared by casting the poly(amic acid) solution on a casting surface and heating at a temperature above 50° C. to partially convert the poly(amic acid) to polyimide. The extent of poly(amic acid) conversion depends on the temperature employed and the time of exposure, but, generally about 25 to 95% of the amic acid groups are converted to imide groups. The partially converted poly(amic acid) is then thermally converted to the polyimide by heating at temperatures above 350° C., preferably above 400° C.

The aromatic polyimide films used in the aromatic polyimide laminate of this invention contain from 400 ppm to 10,000 ppm of tin. When amounts of tin less than 400 ppm are used, little improvement in adhesion properties is obtained. If the tin concentration exceeds 10,000 ppm, the mechanical properties of the polyimide film may be adversely affected. The preferred amount of tin used in the polyimide films ranges from 1000 to 4000 ppm, most preferably from 1200 to 3500 ppm.

The tin-containing polyimide films can be prepared by introducing a minor amount of an organotin compound as described in U.S. Pat. No. 5,272,194 or a tin (II) or tin (IV) salt as described in U.S. Pat. No. 5,218,034, prior to the casting step, into the film forming poly(amic acid) solution or during polymerization of the poly(amic acid). A particularly preferred organotin compound for use in the invention is bis-tributyltinoxide. Additionally, a tin metal salt solution can be coated on one or both sides of either the partially cured poly(amic acid) gel film or the solvated poly(amic acid) film before the final curing and drying step as described in U.S. Pat. No. 5,227,244.

The aromatic tin-containing polyimide films used to produce the aromatic polyimide laminate of the invention have, independently from each other, a thickness of from 25 microns to 125 microns, more preferably from 25 microns to 75 microns.

The aromatic polyimide laminate of the invention is minimally composed of at least one first aromatic polyimide film layer and at least one second aromatic polyimide film layer, which are superimposed on and heat-press bonded to each other.

The aromatic polyimide laminate of the present invention is preferably composed of multiple aromatic polyimide film layers which are superimposed on and heat-press bonded to each other to form a polyimide laminate having a desired thickness.

The aromatic polyimide laminate of the present invention has a thickness of 50 microns or more, preferably 150 microns to 2.5 centimeters, more preferably 150 microns to 2000 microns. Very thick laminates can be prepared having thicknesses ranging from 50 microns to 7.5 centimeters and containing from 2 to 3000 film layers.

In the process of the present invention for preparing an aromatic polyimide laminate having a thickness of 50 microns or more, multiple polyimide film layers are superimposed directly on each other without using an adhesive layer therebetween to form a precursor laminate material, and the precursor laminate material is subsequently heat-pressed at a temperature of from 400° C. to 455° C., preferably, from 425° C. to 455° C., to directly bond the polyimide films.

The heat-press bonding operation is preferably carried out at the above described temperature under a pressure of from 24 bar to 690 bar, most preferably from 24 bar to 45 bar for from 5 minutes to 3 hours, most preferably from 10 minutes to 20 minutes.

The heat-press bonding operating is preferably carried out under a reduced pressure of 760 mm Hg or less, such as in a vacuum.

The aromatic polyimide laminate of the present invention can be used in a variety of applications, for example, as an electronic stiffener for flex circuits, speaker coil, shims for aerospace applications, punched parts, machined parts, electrical switch gears and static seals and gaskets.

The specific examples presented hereinbelow will serve to more fully explain how the present invention can be practically used. However, it should be understood that the examples are only illustrative and in no way limit the present invention. All parts and percentages are by weight unless otherwise indicated.

GLOSSARY

PMDA=pyromellitic dianhydride
BPDA=3,3',4,4'-biphenyltetracarboxylic dianhydride
PPD=p-phenylene diamine
DADE=4,4'-diaminodiphenyl ether
TBTO=bis-tributyltin oxide
HN=PMDA/DADE polyimide film
HN-ZT=PMDA/DADE polyimide film containing TBTO
EN=60% PMDA/40% BPDA/60% PPD/40% DADE copolyimide film
EN-ZT=60% PMDA/40% BPDA/60% PPD/40% DADE copolyimide film containing TBTO
XSN=PMDA/DADE polyimide film coated on one side with 5% tin (II) diacetate

Comparative Examples 1C to 8C

Samples of 25 microns, 50 microns, 75 microns, and 125 microns thick PMDA/DADE polyimide films were stacked together and placed in an autoclave where they were processed through a temperature/pressure cycle. There were two sheets of film in each sample. Sample configuration prior to being placed in the autoclave is shown in FIG. I. The autoclave setup allowed the sample to be under vacuum while pressure was applied to a sealed bagging sheet covering the sample. When in the autoclave, the autoclave pressure was held at ambient pressure while the temperature was increased. At a sample temperature of 370° C., the autoclave pressure was increased to 44.8 bar. The temperature was then increased to 425° C., held at that temperature for 10 minutes, and then cooled at 2.8° C. per minute to 175° C. At 175° C., the cooling rate was increased to 11.1° C. per minute. The autoclave pressure was returned to ambient at a temperature of 90° C. The autoclave was opened and the samples removed when the sample temperature reached 55° C.

Examples 1 to 8.

Samples of 25 microns, 50 microns, 75 microns and 125 microns thick PMDA/DADE polyimide film were prepared using an additive solution containing bis-tributyltinoxide (TBTO) such that the tin (Sn) concentration in the polymer was 1200 ppm. Two sheets of film were then stacked together and placed in autoclave where they were processed through a temperature/pressure cycle. Sample configuration prior to being placed in the autoclave is shown in FIG. I. The autoclave design allowed the samples to be under vacuum while pressure was applied to a sealed bagging sheet covering the samples. When in the autoclave, the autoclave pressure was held at ambient pressure while the temperature was increased. At a sample temperature of 370° C., the autoclave pressure was increased to 44.8 bar. The temperature was then increased to 425° C., held at that temperature for 10 minutes, and then cooled at 2.8° C. per minute to 175° C. At 175° C., the cooling rate was increased to 11.1° C. per minute. The autoclave pressure was returned to ambient at a temperature of 90° C. The autoclave was opened and the samples removed when the sample temperature reached 55° C.

In Comparative Examples 1C to 8C, the layers of film could be easily separated. In Examples 1 to 8 of the invention containing tin, the layers of polyimide film were tightly fused together to form a single thick polyimide laminate. The individual layers of polyimide film which formed the sample could not be separated. The properties of the resulting thick polyimide laminates are given in Table I.

Comparative Examples 9C to 16C

Samples of 25 microns, 50 microns, 75 microns and 125 microns PMDA/BPDA/PPD/DADE polyimide film were stacked together and placed in an autoclave where they were processed through a temperature pressure cycle. Sample configuration prior to being placed in the autoclave is shown in FIG. I. Each sample contained two sheets of film. The autoclave setup allowed the sample to be under vacuum while pressure was applied to a sealed bagging sheet covering the sample. When in the autoclave, the autoclave pressure was held at ambient pressure while the temperature was increased. At a sample temperature of 370° C., the autoclave pressure was increased to 44.8 bar. The temperature was then increased to 425° C., held at that temperature for 10 minutes, and then cooled at 2.8° C. per minute to 175° C. At 175° C., the cooling rate was increased to 11.1° C. per minute. The autoclave pressure was returned to ambient at a temperature of 90° C. The autoclave was opened and the samples were removed when the sample temperature reached 55° C.

Examples 9 to 12

Samples of 25 microns and 50 microns PMDA/BPDA/PPD/DADE polyimide film were prepared using an additive solution containing bis-tributyltinoxide (TBTO) such that the tin (Sn) concentration in the polymer was 3500 ppm. Two sheets of film were then stacked together and placed in an autoclave where they were processed through a temperature/pressure cycle. Sample configuration prior to being placed in the autoclave is shown in FIG. I. The autoclave design allowed the samples to be under vacuum while pressure was applied to a sealed bagging sheet covering the samples. Once the samples were placed in the autoclave, the autoclave pressure was held at ambient pressure while the temperature was increased. At a sample temperature of 370° C., the autoclave pressure was increased to 44.8 bar. The temperature was then increased to 425° C., held at that temperature for 10 minutes, and then cooled at 2.8° C. per minute to 175° C. At 175° C., the cooling rate was increased to 11.1° C. per minute. The autoclave pressure was returned to ambient at a temperature of 90° C. The autoclave was opened and the samples were removed when the temperature reached 55° C.

In Comparative Examples 9C to 16C, the layers of polyimide film could be easily separated. In Examples 9 to 12 of the invention containing tin, the layers of polyimide film were tightly fused together to form a single thick polyimide laminate. The individual layers of film which formed the sample could not be separated. The properties of the resulting thick polyimide laminates are given in Table I.

TABLE I

| | Material Used For Laminate | | | | Autoclave Conditions | | | | Laminate | |
|---|---|---|---|---|---|---|---|---|---|---|
| Example No. | Film Type | Thickness (Microns) | Number of Layers | Sn (PPM) | Max. Temp. (°C.) | Max. Press (bar) | Vacuum (mm Hg) | Minutes at Max. Temp. | Thickness (Microns) | Bond Strength* |
| 1C | 100HN | 25 | 2 | 0 | 400 | 44.8 | 760 | 10 | 50 | No bond |
| 2C | 200HN | 50 | 2 | 0 | 400 | 44.8 | 760 | 10 | 100 | No bond |
| 3C | 300HN | 75 | 2 | 0 | 400 | 44.8 | 760 | 10 | 150 | No bond |
| 4C | 500HN | 125 | 2 | 0 | 400 | 44.8 | 760 | 10 | 250 | No bond |
| 5C | 100HN | 25 | 2 | 0 | 425 | 44.8 | 760 | 10 | 50 | No bond |
| 6C | 200HN | 50 | 2 | 0 | 425 | 44.8 | 760 | 10 | 100 | No bond |
| 7C | 300HN | 75 | 2 | 0 | 425 | 44.8 | 760 | 10 | 150 | No bond |
| 8C | 500HN | 125 | 2 | 0 | 425 | 44.8 | 760 | 10 | 250 | No bond |
| 1 | 100HN-ZT | 25 | 2 | 1200 | 400 | 44.8 | 760 | 10 | 50 | Strong Peel |
| 2 | 200HN-ZT | 50 | 2 | 1200 | 400 | 44.8 | 760 | 10 | 100 | Strong Peel |
| 3 | 300HN-ZT | 75 | 2 | 1200 | 400 | 44.8 | 760 | 10 | 150 | Strong Peel |
| 4 | 500HN-ZT | 125 | 2 | 1200 | 400 | 44.8 | 760 | 10 | 250 | Strong Peel |
| 5 | 100HN-ZT | 25 | 2 | 1200 | 425 | 44.8 | 760 | 10 | 50 | Fused |
| 6 | 200HN-ZT | 50 | 2 | 1200 | 425 | 44.8 | 760 | 10 | 100 | Fused |
| 7 | 300HN-ZT | 75 | 2 | 1200 | 425 | 44.8 | 760 | 10 | 150 | Fused |
| 8 | 500HN-ZT | 125 | 2 | 1200 | 425 | 44.8 | 760 | 10 | 250 | Fused |
| 9C | 100EN | 25 | 2 | 0 | 400 | 44.8 | 760 | 10 | 50 | No bond |
| 10C | 200EN | 50 | 2 | 0 | 400 | 44.8 | 760 | 10 | 100 | No bond |
| 11C | 300EN | 75 | 2 | 0 | 400 | 44.8 | 760 | 10 | 150 | No bond |
| 12C | 500EN | 125 | 2 | 0 | 400 | 44.8 | 760 | 10 | 250 | No bond |
| 13C | 100EN | 25 | 2 | 0 | 425 | 44.8 | 760 | 10 | 50 | No bond |
| 14C | 200EN | 50 | 2 | 0 | 425 | 44.8 | 760 | 10 | 100 | No bond |
| 15C | 300EN | 75 | 2 | 0 | 425 | 44.8 | 760 | 10 | 150 | No bond |
| 16C | 500EN | 125 | 2 | 0 | 425 | 44.8 | 760 | 10 | 250 | No bond |
| 9 | 100ENZT | 25 | 2 | 3500 | 400 | 44.8 | 760 | 10 | 50 | Strong Peel |
| 10 | 200ENZT | 50 | 2 | 3500 | 400 | 44.8 | 760 | 10 | 100 | Strong Peel |
| 11 | 100ENZT | 25 | 2 | 3500 | 425 | 44.8 | 760 | 10 | 50 | Fused |
| 12 | 200ENZT | 50 | 2 | 3500 | 425 | 44.8 | 760 | 10 | 100 | Fused |

*Bond Strength:
Fused - could not separate layers
Strong Peel - Could separate layers only with difficulty, some tearing
Medium Peel - Could separate layers with some difficulty, no tearing
Light Peel - Layers easily separated
No Bond - No effort needed to separate layers

Examples 13 to 55

The polyimide laminates of Examples 13 to 55 were prepared by the same procedure used to prepare the polyimide laminates of Examples 1 to 12 using an additive solution containing bis-tributyltin oxide. The polyimide film layers contained amounts of tin ranging from 200 ppm to 3500 ppm. Strong peels, where the separate polyimide film layers could be separated only with difficulty, were obtained using 400 ppm tin.

In Examples 42 and 43, the poly(amic acid) gel film was coated on one side with a 5% solution of tin (II) diacetate in N,N-dimethylacetamide. The coated film was dried and cured to form the polyimide film. Laminates were subsequently prepared by directly heat-press bonding two film layers coated-side to coated-side (Example 42) and uncoated-side to uncoated-side (Example 43).

Very thick laminates could be readily obtained ranging in thickness from 50 microns to 7.5 centimeters and containing from 2 to 3000 independent film layers. There is no limit to the maximum laminate thickness that can be obtained as long as heat transfer allows the center of the laminate precurser to achieve the required temperature.

The maximum temperature required to obtain the highest laminate bond strength is 425° C. to 455° C. At 400° C., a light or tack seal is obtained, i.e. the film layers can be separated, whereas at 425° C. and above, complete fusion occurs and the film layers cannot be separated. The properties of the thick aromatic polyimide laminates are given in Tables II and III.

TABLE II

| Example No. | Material Used For Laminate | | | | Autoclave Conditions | | | | Laminate | |
|---|---|---|---|---|---|---|---|---|---|---|
| | Film Type | Thickness (Microns) | Number of Layers | Sn (PPM) | Max. Temp. (°C.) | Max. Press (Bar) | Vacuum (mm Hg) | Minutes at Max. Temp. | Thickness (Microns) | Bond Strength* |
| 13 | 50HN-ZT | 13 | 4 | 1800 | 455 | 44.8 | 760 | 10 | 50 | Fused |
| 14 | 100HN-ZT | 25 | 4 | 1200 | 455 | 44.8 | 760 | 10 | 100 | Fused |
| 15 | 500HN-ZT | 125 | 2 | 1200 | 455 | 44.8 | 760 | 10 | 255 | Fused |
| 16 | 100EN-ZT | 25 | 2 | 3500 | 455 | 44.8 | 760 | 10 | 50 | Fused |
| 17 | 200EN-ZT | 50 | 6 | 3500 | 455 | 44.8 | 760 | 10 | 325 | Fused |
| 18 | 50HN-ZT | 13 | 4 | 1800 | 425 | 44.8 | 760 | 10 | 50 | Fused |
| 19 | 100HN-ZT | 25 | 2 | 1200 | 425 | 44.8 | 760 | 10 | 50 | Fused |
| 20 | 100HN-ZT | 25 | 4 | 1200 | 425 | 44.8 | 760 | 10 | 100 | Fused |
| 21 | 200HN-ZT | 50 | 2 | 1200 | 425 | 44.8 | 760 | 10 | 100 | Fused |
| 22 | 300HN-ZT | 75 | 2 | 1200 | 425 | 44.8 | 760 | 10 | 150 | Fused |
| 23 | 300HN-ZT | 75 | 3 | 1200 | 425 | 44.8 | 760 | 10 | 225 | Fused |
| 24 | 300HN-ZT | 75 | 5 | 1200 | 425 | 44.8 | 760 | 10 | 380 | Fused |
| 25 | 300HN-ZT | 75 | 10 | 1200 | 425 | 44.8 | 760 | 10 | 250 | Fused |
| 26 | 300HN-ZT | 75 | 20 | 1200 | 425 | 44.8 | 760 | 10 | 1525 | Fused |
| 27 | 300HN-ZT | 75 | 40 | 1200 | 425 | 44.8 | 760 | 10 | 3050 | Fused |
| 28 | 300HN-ZT | 75 | 144 | 1200 | 425 | 44.8 | 760 | 10 | 10,970 | Fused |
| 29 | 500HN-ZT | 125 | 2 | 1200 | 425 | 44.8 | 760 | 10 | 255 | Fused |
| 30 | 500HN-ZT | 125 | 3 | 1200 | 425 | 44.8 | 760 | 10 | 380 | Fused |
| 31 | 500HN-ZT | 125 | 4 | 1200 | 425 | 44.8 | 760 | 10 | 510 | Fused |
| 32 | 500HN-ZT | 125 | 5 | 1200 | 425 | 44.8 | 760 | 10 | 635 | Fused |
| 33 | 500HN-ZT | 125 | 6 | 1200 | 425 | 44.8 | 760 | 10 | 760 | Fused |
| 34 | 100EN-ZT | 25 | 2 | 3500 | 425 | 44.8 | 760 | 10 | 50 | Fused |
| 35 | 200EN-ZT | 50 | 2 | 3500 | 425 | 44.8 | 760 | 10 | 100 | Fused |
| 36 | 200EN-ZT | 50 | 2 | 3500 | 425 | 44.8 | 760 | 10 | 100 | Fused |
| 37 | 200EN-ZT | 50 | 4 | 3500 | 425 | 44.8 | 760 | 10 | 205 | Fused |
| 38 | 200EN-ZT | 50 | 5 | 3500 | 425 | 44.8 | 760 | 10 | 255 | Fused |
| 39 | 300HN-ZT | 75 | 5 | 600 | 425 | 44.8 | 760 | 10 | 380 | Fused |
| 40 | 300HN-ZT | 75 | 5 | 400 | 425 | 44.8 | 760 | 10 | 380 | Strong Peel |
| 41 | 300HN-ZT | 75 | 5 | 200 | 425 | 44.8 | 760 | 10 | 380 | Light Peel |
| 42 | 100XSN** | 25 | 2 | Coated side to coated side | 425 | 44.8 | 760 | 10 | 50 | Strong Peel |
| 43 | 100XSN** | 25 | 2 | Uncoated side to uncoated side | 425 | 44.8 | 760 | 10 | 50 | No Bond |
| 44 | 100HN-ZT | 25 | 2 | 1200 | 400 | 44.8 | 760 | 10 | 50 | Light Peel |
| 45 | 100HN-ZT | 25 | 4 | 1200 | 400 | 44.8 | 760 | 10 | 100 | Med. Peel |
| 46 | 200HN-ZT | 50 | 2 | 1200 | 400 | 44.8 | 760 | 10 | 100 | Light Peel |
| 47 | 200HN-ZT | 50 | 4 | 1200 | 400 | 44.8 | 760 | 10 | 205 | Med. Peel |
| 48 | 300HN-ZT | 75 | 2 | 1200 | 400 | 44.8 | 760 | 10 | 100 | Med. Peel |
| 49 | 300HN-ZT | 75 | 4 | 1200 | 400 | 44.8 | 760 | 10 | 305 | Med. Peel |
| 50 | 500HN-ZT | 125 | 2 | 1200 | 400 | 44.8 | 760 | 10 | 255 | Strong Peel |
| 51 | 500HN-ZT | 125 | 5 | 1200 | 400 | 44.8 | 760 | 10 | 510 | Strong Peel |
| 52 | 100EN-ZT | 25 | 2 | 3500 | 400 | 44.8 | 760 | 10 | 50 | Light Peel |
| 53 | 100EN-ZT | 25 | 3 | 3500 | 400 | 44.8 | 760 | 10 | 75 | Light Peel |
| 54 | 200EN-ZT | 50 | 2 | 3500 | 400 | 44.8 | 760 | 10 | 100 | Strong Peel |
| 55 | 200EN-ZT | 50 | 3 | 3500 | 400 | 44.8 | 760 | 10 | 150 | Strong Peel |

*Bond Strength:
Fused - could not separate layers
Strong Peel - Could separate layers only with difficulty, some tearing

TABLE II-continued

| | Material Used For Laminate | | | Autoclave Conditions | | | | Laminate | |
|---|---|---|---|---|---|---|---|---|---|
| | | | | Max. | Max. | | Minutes | | |
| Example No. | Film Type | Thickness (Microns) | Number of Layers | Sn (PPM) | Temp. (°C.) | Press (Bar) | Vacuum (mm Hg) | at Max. Temp. | Thickness (Microns) | Bond Strength* |

Medium Peel - Could separate layers with some difficulty, no tearing
Light Peel - Layers easily separated
No Bond - No effort needed to separate layers
**100XSN was prepared by coating one side of the poly(amic acid) gel film with 5% stannous acetate solution, followed by drying and curing to form the polyimide

TABLE III

| | Example No. | | | | | | |
|---|---|---|---|---|---|---|---|
| | 23 | 24 | 26 | 29 | 31 | 32 | 33 |
| | Film Type | | | | | | |
| | 300HN-ZT | 300HN-ZT | 300HN-ZT | 500HN-ZT | 500HN-ZT | 500HN-ZT | 500HN-ZT |
| | No. of Layers | | | | | | |
| | 3 | 5 | 20 | 2 | 4 | 5 | 6 |
| Measured Thickness (Avg. - Microns) | 236 | 389 | 1529 | 262 | 516 | 641 | 772 |
| MD Modulus (Gpa) (1) | 2.9 | — | — | — | — | — | — |
| MD Tensile (Mpa) | 188.9 | 173.8 | — | 177.2 | 163.4 | 144.1 | 161.4 |
| MD Elongation (%) | 22.3 | 16.7 | — | 16.5 | 14.6 | 13.4 | 18.4 |
| Dielectric Strength (Volts/μM) (2) | 116 | 82 | 202 | 106 | 65 | 56 | 48 |
| Hydrolytic Delamination (3) | 0/0 | 0/0 | 0/0 | 0/0 | 0/0 | 0/0 | 0/0 |

(1) ASTM Method D-882
(2) ASTM Method D-149
(3) Samples were put through hydrolytic stability test and then checked for delamination. Test was 1 hour at 108° C. in Paar-bomb saturated with water.

What is claimed is:

1. An aromatic polyimide laminate having a thickness of at least 50 microns, comprising multiple aromatic polyimide film layers superimposed on and directly bonded to each other without using an adhesive, wherein each of said aromatic polyimide film layers independently contains from 400 to 10,000 ppm of tin.

2. The aromatic polyimide laminate of claim 1 wherein the aromatic polyimide film layers comprise the polymerization-imidization reaction product of an aromatic tetracarboxylic dianhydride component and an aromatic diamine component.

3. The aromatic polyimide laminate of claim 2 wherein the aromatic tetracarboxylic dianhydride component comprises pyromellitic dianhydride and the aromatic diamine component comprises 4,4'-diaminodiphenyl ether.

4. The aromatic polyimide laminate of claim 2 wherein the aromatic tetracarboxylic dianhydride component comprises pyromellitic dianhydride and 3,3',4,4'-biphenyltetracarboxylic dianhydride and the aromatic diamine component comprises 4,4'-diaminodiphenyl ether and p-phenylene diamine.

5. The aromatic polyimide laminate of claim 4 wherein the aromatic tetracarboxylic dianhydride component comprises from 15 to 85 mole % of pyromellitic dianhydride and from 15 to 85 mole % of 3,3',4,4'-biphenyltetracarboxylic dianhydride, and the aromatic diamine component comprises from 30 to 100 mole % of p-phenylene diamine and from 0 to 70 mole % of 4,4'-diaminodiphenyl ether.

6. The aromatic polyimide laminate of claim 5 wherein the aromatic tetracarboxylic dianhydride component comprises 60 mole % of pyromellitic dianhydride and 40 mole % of 3,3',4,4'-biphenyltetracarboxylic dianhydride, and the aromatic diamine component comprises 60 mole % of p-phenylene diamine and 40 mole % of 4,4'-diaminodiphenyl ether.

7. The aromatic polyimide laminate of claim 1, wherein the aromatic polyimide film layers are the same and have a thickness of from 25 microns to 125 microns.

8. The aromatic polyimide laminate of claim 7, wherein the aromatic polyimide film layers have the same thickness.

9. The aromatic polyimide laminate of claim 7, wherein the aromatic polyimide film layers have a different thickness.

10. The aromatic polyimide laminate of claim 1, wherein the aromatic polyimide film layers are different and have a thickness of from 25 microns to 125 microns.

11. The aromatic polyimide laminate of claim 10, wherein the aromatic polyimide film layers have the same thickness.

12. The aromatic polyimide laminate of claim 10, wherein the aromatic polyimide film layers have a different thickness.

13. The aromatic polyimide laminate of claim 1, wherein the aromatic polyimide film layers independently contain from 1000 to 4000 ppm of tin.

14. The aromatic polyimide laminate of claim 13, wherein the aromatic polyimide film layers independently contain from 1200 to 3500 ppm of tin.

15. The aromatic polyimide laminate of claim 1 comprising from 2 to 3000 polyimide film layers and having a thickness of from 50 microns to 7.5 centimeters.

16. The aromatic polyimide laminate of claim 7 wherein the aromatic polyimide film layers comprise the polymerization-imidization reaction product of pyromellitic dianhydride and 4,4'-diaminodiphenyl ether and independently contain from 1200 to 1800 ppm of tin.

17. The aromatic polyimide laminate of claim 7, wherein the aromatic polyimide film layers comprise the polymerization-imidization reaction product of from 15 to 85 mole % of pyromellitic dianhydride, from 15 to 85 mole % of 3,3',4,4'-biphenyltetracarboxylic dianhydride, from 30 to 100 mole % of p-phenylene diamine and from 0 to 70 mole % of 4,4'-diaminodiphenyl ether and independently contain from 1200 to 3500 ppm of tin.

18. An aromatic polyimide laminate having a thickness of at least 50 microns, comprising multiple aromatic polyimide film layers superimposed on and directly bonded to each other without using an adhesive, wherein each of said aromatic polyimide film layers are coated on one or both sides with an organic solvent solution containing from 0.1 to 10 weight % of a tin (II) or tin (IV) salt.

19. The aromatic polyimide laminate of claim 18 wherein the organic solvent solution of the tin (II) or tin (IV) salt is coated on either a partially cured or partially dried poly(amic acid) film prior to final drying and curing to form the polyimide film.

20. The aromatic polyimide laminate of claim 18 wherein the organic solvent comprises N,N-dimethylacetamide, N,N-diethylacetamide, N,N-dimethylformamide, N-methyl-2-pyrrolidone, dimethylsulfone or hexamethylphosphoramide.

21. The aromatic polyimide laminate of claim 18 wherein the tin (II) or tin (IV) salt comprises tin (II) or tin (IV) chloride, bromide, acetate, acetylacetonate or formate.

* * * * *